United States Patent [19]
Boerner et al.

[11] Patent Number: 4,849,986
[45] Date of Patent: Jul. 18, 1989

[54] OPTICAL RESONATOR MATRIX

[75] Inventors: Manfred Boerner, Ulm; Reinhard Mueller, Ingolstadt; Gert Trommer, Muenchen, all of Fed. Rep. of Germany

[73] Assignee: Siemens Aktiengesellschaft, Berlin and Munich, Fed. Rep. of Germany

[21] Appl. No.: 84,086

[22] Filed: Aug. 11, 1987

[30] Foreign Application Priority Data

Aug. 22, 1986 [DE] Fed. Rep. of Germany ....... 3628499

[51] Int. Cl.$^4$ .......................... H01S 3/082; G02B 6/10
[52] U.S. Cl. .................................... 372/97; 350/96.12; 372/25; 372/29; 372/50
[58] Field of Search .................. 350/96.12; 372/23, 29, 372/50, 25, 97

[56] References Cited

FOREIGN PATENT DOCUMENTS 0138696 12/1978 Japan ..................................... 372/97

OTHER PUBLICATIONS

J. W. Rose, "High Density Optical Waveguide Array", IBM Technical Disclosure Bulletin, vol. 23, No. 10, Mar. 1981, pp. 4453–4454.
M. Samwaten et al., "Nd–glass laser with three dimensional optical waveguide", Appl. Phy. Letts., vol. 24, No. 12, Jan. 15, 1974, pp. 603–605.
Sorin et al., "Single-Mode-Fiber Ring Dye Laser", Optics Letters vol. 10, No. 11, Nov. 1985, pp. 550–552.

Primary Examiner—William L. Sikes
Assistant Examiner—Georgia Y. Epps

[57] ABSTRACT

An arrangement of optical resonators which are composed of elongated optical waveguides comprising reflectors arranged at their end faces, one group of the waveguides being coupling resonators and a second group of the waveguides being useful resonators which are arranged in a substrate with the useful resonators being adjacent one surface thereof. A laser active material is provided adjacent the one surface of the substrate and can be either a semiconductor laser material or can be a light pump laser material. At least one of the waveguides of the useful resonators being composed of optically passive material, which has good wave-conducting properties, and being positioned adjacent to the laser active material so that a wave field excited in the waveguide can be intensified by the laser active material.

12 Claims, 1 Drawing Sheet

OPTICAL RESONATOR MATRIX

BACKGROUND OF THE INVENTION

The present invention is directed to an arrangement of optical resonators which are composed of elongated optical waveguides having reflectors arranged at each end face, said optical resonators being integrated matrix-like on a substrate with one group of resonators being highly coupled to one another and acting as coupling resonators and a second group of resonators being weakly coupled to the coupling resonators in the first group in comparison to the high coupling between the coupling resonators of the first group and acting as wavelength-selective useful resonators and at least one pumpable region of laser active material being present.

An arrangement of optical resonators integrated into a matrix on a substrate and having groups of coupling resonators and groups of wavelength-selective useful resonators, as well as a pumpable region of laser active material has been proposed and disclosed in an earlier filed U.S. Pat. application Ser. No. 924,848, filed Oct. 14, 1986, which claims priority from German Patent Application P No. 35 06 569.9. In the arrangements disclosed in this U.S. application, the material of the optical waveguides of at least one of the useful resonators is composed of a laser active material so that this optical waveguide is identical to the range of laser active material of the arrangement. The wave field excited in the optical waveguide can be intensified by pumping the laser active material. For example, the optical waveguide can be composed of laser active crystal material and is arranged in a pn-junction operating in a conducting direction for this purpose.

SUMMARY OF THE INVENTION

An object of the present invention is to provide an arrangement of optical resonators which are relatively easy to manufacture and wherein the optical waveguides of the useful resonators have a wave field that can be intensified by pumping the laser active material and have good wave-conducting properties which will correspond to those of a good, unpumped dielectric waveguide.

To accomplish these goals, the present invention is directed to an improvement of an arrangement of optical resonators which are composed of elongated optical waveguides having reflectors arranged at each of their end faces, said optical resonators being integrated matrix-like on a substrate with one group of optical resonators being highly coupled to one another and acting as coupling resonators, a second group of optical resonators being weakly coupled to the coupling resonators in comparison to the high coupling between the coupling resonators and acting as wavelength-selective useful resonators, and at least one pumpable region of laser active material in the arrangement. The improvements are that the optical waveguide of at least one of the useful resonators of the second group is composed of an optically passive material and that the regions of the laser active material is arranged outside of this one waveguide and adjacent thereto so that when pumping the laser active material a wave field excited in this waveguide will extend into the inversion region of the region of laser active material and can be intensified therein. It should be noted that the term "optically passive material" denotes a non-laser active material.

The fact that the optical waveguide of a useful resonator whose wave field can be intensified by pumping laser active material and that the region which contains this laser active material are separated from one another in this application enables a material to be selected for the waveguide with which extremely good waveguide structures can be obtained. Thus, the wave field excited in this waveguide can continue to be intensified. Moreover, this separation of the waveguide and the region comprising the laser active material enables the region of laser active material to be arranged outside of the arrangement of the resonator or the resonator matrix, and this enables a simpler manner of manufacturing the device or arrangement.

One of the preferred arrangements of the invention is that the region of laser active material is arranged adjacent one surface of the substrate and the one optical waveguide of the useful resonators is arranged adjacent this and, thus, the region is spaced from the group of coupling resonators.

Preferably, the laser active material can be either a dyestuff laser fluid which can be optically pumped, a crystal laser active material which can be optically pumped, a crystal laser active material which is pumped by a pn-junction operated in a conducting direction. When the laser active material is optically pumped, it is supplied with a pump light from the outside, either by being arranged on a surface of the substrate and being pumped by light being exposed directly onto this surface or by light being conducted by in-coupling waveguides to the first group of resonators with the resonators resonating the light and conducting it to the laser active material.

In the preferred embodiment, the second group of useful resonators, as well as the one resonator, are arranged at a surface of the substrate or as close as possible to the surface of the substrate. The laser active material is then applied to this surface and entirely or partially covers the optical waveguides of the second group of useful resonators. This construction of the arrangement enables an especially simple manufacture, because the laser active material need only be applied to the surface of the substrate. This enables the laser active material to be exposed for optical pumping. If desirable, the laser active material can be fashioned as a thin film or a layer waveguide in which the pump light can be coupled from the outside or can be coupled in via an end face of the film or layer.

An arrangement of the invention has the advantage that no pn-junctions for pumping are required within the resonator matrix. If pn-junctions are nonetheless provided in the region of the useful resonators, then these increase the degree of freedom of the resonator tuning on the basis of charge carrier injection or extraction. Moreover, it enables a modulation of the wave field. Accordingly, an advantageous embodiment of the invention has at least the one optical waveguide for the one useful resonator being arranged between semiconductor regions on the substrate which are doped opposite to one another.

An arrangement of the invention can, for example, be used for generating a carrier wave grid or for realizing a linear laser amplifier with three dimensionally separated channel amplifiers which, due to the narrow bandedness is noise-freer than a normal linear laser amplifier.

Other advantages and features of the invention will be readily apparent from the following drawings, description of preferred embodiments and claims.

DESCRIPTION OF THE PREFERRED EMBODIMENTS

Figure 1:
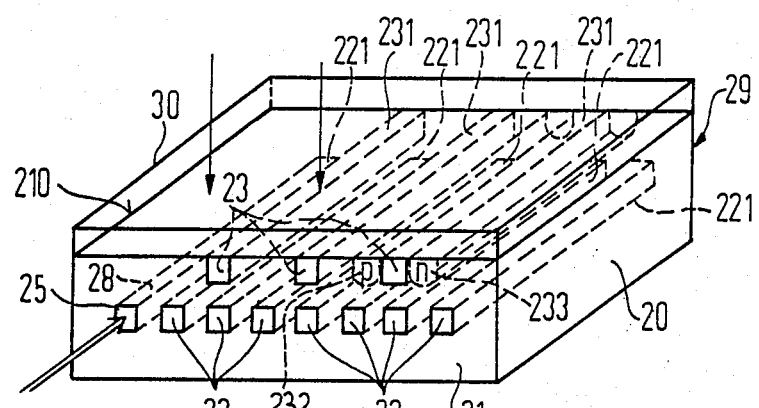
FIG. 1 is a perspective view of a resonator matrix having a layer of optically pumpable, laser active material applied to a surface at which the useful resonators are arranged in accordance with the present invention.
Figure 2:
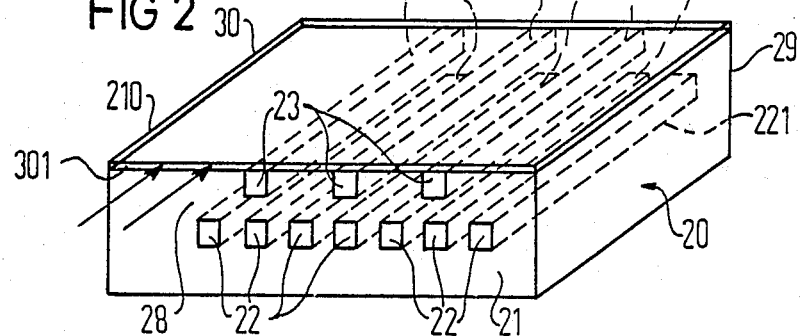
FIG. 2 is a perspective view of a resonator matrix similar to FIG. 1 having a thin film or layer waveguide of optically pumpable laser active material in accordance with the present invention.
Figure 3:
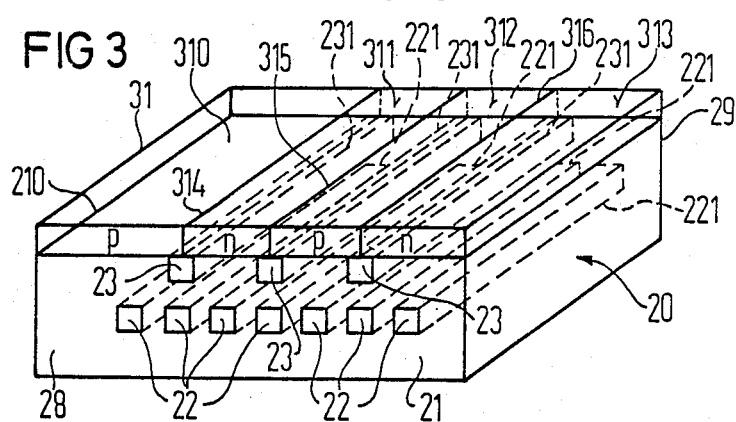
FIG. 3 is a laser matrix similar to FIGS. 1 and 2, having a layer of laser active material composed of material in which pn-junctions operable in the conducting direction are provided in accordance with the present invention.

The principles of the present invention are particularly useful when incorporated in a laser matrix generally indicated at 20 in each of FIGS. 1, 2 and 3. The laser matrix 20 has a substrate 21 in which a first group of resonators 22 and a second group of resonators 23 have been integratedly formed. The first group of resonators 22 have a high coupling therebetween and are referred to as coupling resonators. The second group of resonators 23 are weakly coupled therebetween and to the first group of resonators and act as wavelength-selective useful resonators. Each of the resonators 22 and 23 is composed of an elongated optical waveguide, such as 221 for the resonators 22 and 231 for the second group of resonators 23 and these optical waveguides are integrated into the substrate 21 which, on end surfaces 28 and 29, are provided with highly reflecting reflectors. As illustrated, preferably all the optical waveguides 221 and 231 extend parallel to one another. The waveguides 231 of the second group of resonators 23 proceed adjacent a surface 210 of the substrate 21 and the waveguides forming the coupling resonators 22 are arranged under the second group of resonators 23, as illustrated.

This resonator matrix is similar to those disclosed in the above-mentioned U.S. Pat. application Ser. No. 924,848. Such a resonator, as well as others disclosed in the above-mentioned application can be constructed and manufactured, as disclosed by that application, and can be utilized in the manners proposed by that application.

The optical waveguides 221 and 231 are composed of non-laserable material. Materials with which optimum waveguide properties can be achieved are selected for the substrate 21 and for the waveguides 221 and 231. Thus, these waveguides and the substrate are formed of "optical passive material".

A layer-like region 30 of optically pumpable laser active material is directly applied on the upper surface 210. This region 30 completely covers the surface 210 and, thus, the sides of the optical waveguides 231 or the useful resonators 23, which are adjacent this upper surface. As illustrated, the layer 30 is on a surface which is separated from the first group of resonators 22 by the second group of resonators 23. This is extremely practical in view of the simple manner of manufacturing the device.

The materials of the region 30 can be optically pumpable, laser active crystal materials, for example, neodymium-YAG, which can be applied in a known epitaxial method. However, it can also be a dyestuff laser fluid, which is optically pumped and offers the additional advantage that a refractive index matching can be undertaken. Let it be pointed out in this context that a single-mode fiber ring laser is already disclosed in an article in *Optics Letters*, Vol. 10, No. 11, Nov. 1985, pp. 550–552. As disclosed, a monomode fiber piece which is curved and stripped of its fiber cladding is brought into contact with an optically pumpable dyestuff laser fluid for the purpose of a signal intensification.

The pump light can be supplied to the optically pumpable laser active material by exposure of the region 30 from above, as indicated by the arrows. However, it also can be directly supplied by an end coupling waveguide 25 of the resonator matrix which, because of the existing resonance grid, also resonates for the pump light and, thus, conducts the pump emissions into the region 30. Both pumping possibilities are indicated in FIG. 1 and these can be employed either singlarly or simultaneously.

In the embodiment of FIG. 1, the waveguide 231 of a useful resonator 23, for example, the useful resonator 23 arranged at the right hand side in the illustration of FIG. 1, is arranged between two semiconductor regions 232 and 233 of the substrate, which are oppositely doped. For example, each of these regions 232 and 233 are strip-shaped, and extend, for example, over the entire length of the allocated waveguide 231. In FIG. 1, for example, the doped region 232, which is arranged on the left side of the waveguide 231 is p-doped and the region 233 arranged on the right hand side is n-doped. The region 232 could also be n-doped and the region 233 could be then p-doped.

Voltages can be applied to these regions 232 and 233, which are doped opposite with respect to one another via contacts (not illustrated). These voltages are selectively capable of being polarized in inhibiting or conducting directions with reference to the corresponding pn-junction, wherein a p-doped region and an n-doped region adjoin one another. As a result thereof, charges can be selectively extracted from the waveguide 231 or, respectively, injected into this waveguide. The degree of freedom in the resonator matching is therefore increased and, moreover, a modulation of the wave field excited in the waveguide 231 is enabled.

The oppositely doped regions 232 and 233 are preferably arranged at a distance from the allocated waveguide 231. They should not project into the waveguide 231; rather, they should at most be adjacent thereto because otherwise, the good, wave-conducting properties of the waveguide would be disturbed.

Of course the waveguide 231 of every other useful resonator 23 can be arranged in the same fashion between two allocated regions doped opposite to one another. Thus, the degree of freedom of resonator tuning is increased for every useful resonator and the wave field fashioned in its waveguide can be modulated.

When the oppositely doped regions 232 and 233 are to be provided in the above sense in the embodiment of FIG. 3, set forth hereinafter, it is expedient to arrange a thin, electrically insulating layer (not shown) between the surface 210 of the substrate 21 and the region 31, which region 31 is composed of the laser active material pumpable by a pn-junction.

In the embodiment of FIG. 2, the layer-shaped region 30 of the optical pumpable, laser active material, is constructed in the form of a thin film or layer waveguide which completely covers the surface 210 and into which the pump light is coupled. This can, for example, be undertaken with traditional prism couplers; however, a coupling can also be undertaken directly via face end 301 of the layer 30. For example, with one or more feeding fibers (not shown).

In the exemplary embodiment of FIG. 3, the region 31 covering the surface 210 is composed of laser active crystal materials which can be pumped by a pn-junction and are composed, for example, of GaAs or GaAlAs, which can be applied in a known epitaxial method. In the exemplary embodiment, every waveguide 231 has a pn-junction 314, 315 and 316 allocated to it, and each of these is arranged on or over the allocated waveguide 231 in a plane, which is perpendicular to the surface 210 of the substrate 21 and contains the allocated waveguide 231. Each of these pn-junctions extends over the entire length of the waveguide 231. The pn-junctions 314, 315 and 316 can be easily manufactured, because the region 31 is formed of a plurality of sub-regions 310, 311, 312, and 313, with the sub-region 310 and 311 forming the junction 314, the sub-region 311 and 312 forming the junction 315, the sub-region 312 and 313 forming the junction 316. These sub-regions, as illustrated, are alternately doped with regions 310 and 312 being p-doped and the regions 311 and 313 being n-doped. The sub-regions can then be electrically contacted by electrical contacts (not shown), which are applied on the surface of the region 31. It should be noted that doping could be just the opposite of that described.

All illustrated embodiments represent the specific case wherein the regions 30 and 31 of the laser active material is directly adjacent to the waveguides 231, as well as to the surface 210 of the substrate 21. A spacing between the waveguides 231 and the regions 30 or 31 of the laser active material can also be present. For example, the waveguides 231 can be arranged under the surface 210, but close to this surface. For example, the waveguides 231 could also be arranged at the surface 210, but could be covered by a covering layer which separates the region 30 or 31 of laser active material from the waveguides.

In all embodiments of the invention, care must be exercised to see that the wave field excited in the waveguides of the useful resonator, which is also present outside of the waveguide and decays with increasing distance from the waveguide, extends into the inversion region of the region of the laser active material generated by pumping and extends thereinto so far that it can be intensified therein. In the embodiment of FIG. 3, this means that given operations thereof and conducting directions, a pn-junction 314, 315 or 316 forming the layer-shaped inversion regions are arranged adequately close to the particular allocated optical waveguides 231. The inversion region is the region of the region 31 of the laser active material in which the inversion required for the generation of the laser emissions is realized by the pumping.

Although various minor modifications may be suggested by those versed in the art, it should be understood that we wish to embody within the scope of the patent granted hereon all such modifications as reasonably and properly come within the scope of our contribution to the art.

We claim:

1. In an arrangement of optical resonators which are composed of elongated optical waveguides having reflectors arranged at their end faces, said optical resonators being integrated matrix-like on a substrate with a first group of optical resonators being highly coupled to one another and acting as coupling resonators and a second group of optical resonators being weakly coupled to each other and to the coupling resonators of the first group in comparison to high coupling between the coupling resonators of the first group, said resonators of the second group acting as wavelength-selective useful resonators, said arrangement including at least one pumpable region of laser active material, the improvements comprising at least one of the optical waveguides of the second group of useful resonators being composed of an optically passive material, and the region of laser active material being arranged outside of this one waveguide and adjacent thereto so that when pumping the laser active material, a wave field excited in the one waveguide will extend into the inversion region of the region of laser active material can be intensified therein.

2. In an arrangement according to claim 1, wherein the region of laser active material is arranged on a surface of the substrate adjacent to the one waveguide of the second group of useful resonators and which surface faces away from the first group of coupling resonators.

3. In an arrangement according to claim 1, wherein the region of laser active material contains a dyestuff laser fluid which is optically pumped.

4. In an arrangement according to claim 1, wherein the region of the laser active material contains a crystal material which is optically pumped.

5. In an arrangement according to claim 1, wherein the region of laser active material contains a crystal material which is pumped by a pn-junction operated in a conducting fashion.

6. In an arrangement according to claim 1, wherein the region of laser active material is optically pumped, said material being supplied with pumping light through an outside surface of the region.

7. In an arrangement according to claim 1, wherein the region of laser active material is optically pumped material, the pumping light being coupled into a coupling resonator of the first group via an end coupling waveguide and being supplied via the useful resonators resonating for the pump light into the region of laser active material which is adjacent to said said group of useful resonators.

8. In an arrangement according to claim 1, wherein the optical waveguides of the second group of useful resonators are arranged closely adjacent a surface of the substrate, the region of laser active material being applied on said surface to at least partially cover the optical waveguides of the second group and said pumping light being coupled into one of the coupling waveguides of the first group of resonators and being supplied to useful resonators of the second group which are resonating for the pump light and supplies the pump light into the region of the laser active material, which is immediately adjacent said useful resonators.

9. In an arrangement according to claim 1, wherein the optical waveguides for the second group of resonators are arranged closely adjacent to a surface of the substrate, said region of laser active material being applied on said surface and at least partially covering each of the optical waveguides of the useful resonator, said laser active material being an optically pumpable material and being exposed to a pumping light through a surface other than the surface of the region adjacent the surface of the substrate.

10. In an arrangement according to claim 1, wherein the optical waveguides of the second group of useful resonators are arranged adjacent a surface of the substrate, said laser active material being a film waveguide covering the one surface of the substrate and being pumped by a light coupled from the outside of the arrangement.

11. In an arrangement according to claim 10, wherein the pumping light is coupled via an end face of the film waveguide.

12. In an arrangement according to claim 1, wherein at least the one optical waveguide of the second group of resonators is arranged between semiconductor regions in the substrate, said semiconductor regions being doped opposite to one another.

* * * * *